(12) United States Patent
An et al.

(10) Patent No.: US 10,978,494 B2
(45) Date of Patent: Apr. 13, 2021

(54) DISPLAY INCLUDING PLURALITY OF WIRING LAYERS IN BENDING REGION

(71) Applicant: Samsung Electronics Co., Ltd., Suwon-si (KR)

(72) Inventors: Jungchul An, Suwon-si (KR); Suyeon Kim, Suwon-si (KR); Sangseol Lee, Suwon-si (KR); Kwangtai Kim, Suwon-si (KR); Hyungsup Byeon, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/269,981

(22) Filed: Feb. 7, 2019

(65) Prior Publication Data
US 2019/0252412 A1    Aug. 15, 2019

(30) Foreign Application Priority Data
Feb. 9, 2018 (KR) .................. 10-2018-0016140

(51) Int. Cl.
*H01L 23/48* (2006.01)
*H01L 21/00* (2006.01)
(Continued)

(52) U.S. Cl.
CPC ........ *H01L 27/124* (2013.01); *H01L 27/1218* (2013.01); *H01L 27/1244* (2013.01);
(Continued)

(58) Field of Classification Search
CPC .................................................. H01L 27/3276
(Continued)

(56) References Cited

U.S. PATENT DOCUMENTS

| 9,274,559 B2 * | 3/2016 | Prushinskiy .......... G06F 1/1652 345/55 |
| 9,276,055 B1 * | 3/2016 | Son ..................... H01L 27/3288 |
| 9,659,966 B2 * | 5/2017 | Kwak ................ H01L 27/1218 |

(Continued)

FOREIGN PATENT DOCUMENTS

| KR | 10-0671660 B1 | 1/2007 |
| KR | 10-1740192 B1 | 5/2017 |

(Continued)

OTHER PUBLICATIONS

International Search Report dated May 7, 2019, issued in International Application No. PCT/KR2019/001558.
(Continued)

*Primary Examiner* — Calvin Lee
(74) *Attorney, Agent, or Firm* — Jefferson IP Law, LLP

(57) ABSTRACT

A display including a bending region is provided. The display includes a pixel layer including a plurality of pixel and a substrate disposed under the pixel layer and including a first area on which the pixel layer is disposed and a second area extending out of the pixel layer from the first area, at least a partial area of the second area being bendable, wherein the substrate includes: a wiring layer including at least one first wiring electrically connected with at least one pixel of the plurality of pixels and connected from the first area to the second area, and at least one second wiring disposed in the at least partial area and electrically connected with the at least one first wiring in the second area. Further, other embodiments may be possible.

18 Claims, 12 Drawing Sheets

(51) Int. Cl.
*H01L 27/12* (2006.01)
*H01L 27/32* (2006.01)
*H01L 51/00* (2006.01)

(52) U.S. Cl.
CPC ........ *H01L 27/323* (2013.01); *H01L 27/3276* (2013.01); *H01L 51/0097* (2013.01)

(58) Field of Classification Search
USPC .................. 438/461, 617; 257/676, 736, 786
See application file for complete search history.

(56) References Cited

U.S. PATENT DOCUMENTS 9,818,974 B2 * 11/2017 Kwon .................... H01L 27/323
9,977,466 B2 * 5/2018 Kwon .................... G06F 1/1652
361/749

| | | |
|---|---|---|
| 2014/0138637 A1 | 5/2014 | Yang et al. |
| 2016/0079336 A1 | 3/2016 | Youn et al. |
| 2017/0199619 A1 | 7/2017 | Lee et al. |
| 2017/0262109 A1 | 9/2017 | Choi et al. |
| 2017/0323934 A1 | 11/2017 | Ki et al. |
| 2017/0345877 A1 | 11/2017 | Hwang |

FOREIGN PATENT DOCUMENTS

| | | |
|---|---|---|
| KR | 10-2017-0083668 A | 7/2017 |
| KR | 10-2017-0106621 A | 9/2017 |

OTHER PUBLICATIONS

European Search report dated Feb. 23, 2021, issued in European Application No. 19751205.6-1230.

* cited by examiner

DISPLAY INCLUDING PLURALITY OF WIRING LAYERS IN BENDING REGION

CROSS-REFERENCE TO RELATED APPLICATION(S)

This application is based on and claims priority under 35 U.S.C. § 119(a) of a Korean patent application number 10-2018-0016140, filed on Feb. 9, 2018, in the Korean Intellectual Property Office, the disclosure of which is incorporated by reference herein in its entirety.

BACKGROUND

1. Field

The disclosure relates to a display. More particularly, the disclosure relates to a display including a bending region.

2. Description of Related Art

An electronic device may refer to a device that performs specific functions in accordance with programs installed therein, such as an electronic notepad, a mobile multimedia player, a mobile communication terminal, a tablet personal computer (PC), a video/sound device, a desktop/laptop computer, and an automobile navigation system, including home appliances. For example, electronic devices can output information stored therein using sound or images. As electronic devices have become highly integrated and high-speed and large-capacity wireless communication has become popular, recently it has become possible to integrate various functions into a single electronic device.

Portable electronic devices include a window and users can see images displayed on the display in the electronic devices through the window from the outside. The window may include a transparent area and a bezel area (e.g., a dead space) surrounding the transparent area. The bezel area is opaque, so it can hide wiring and components under the bezel area.

Portable electronic devices may be formed such that the transparent area of a window is large and the bezel area (e.g., dead space) is small so as to achieve a large screen. The bezel area, which is an area for arranging wiring connected to electrodes of a display or a touch panel in the electronic device, can hide the wiring and provide a gap that can mitigate electromagnetic interference among the wires. For example, the larger the bezel area, the larger the gaps between the wiring may be, that is, electromagnetic interference can be mitigated, or signals can be stably transmitted by sufficiently securing line width of the wirings. However, as the bezel area is increased, the area in which images can be output may be reduced.

The above information is presented as background information only to assist with an understanding of the disclosure. No determination has been made, and no assertion is made, as to whether any of the above might be applicable as prior art with regard to the disclosure.

SUMMARY

Wiring connected to a display or a touch panel may be arranged substantially on a substrate (e.g., a flexible printed circuit board) and may be connected to a driving circuit (e.g., a display driver integrated circuit (IC) (display driver integration (DDI))) or a touch sensor driver IC (T-IC) for driving the display or the touch panel. This substrate may be disposed substantially to correspond to a bezel area and may be bent in a curved line shape or a curved surface shape to increase the ratio of the screen area or reduce the bezel area.

As the substrate is bent, the driving circuit can be disposed under the display, so the bezel area can be decreased. According to the substrate, the bending portion of the substrate formed in a curved line shape or a curved surface shape may be damaged by external force, so a crack may be generated in the wiring. Cracks may even be generated in the wiring by direct contact or friction between a window and the bending portion.

Aspects of the disclosure are to address at least the above-mentioned problems and/or disadvantages and to provide at least the advantages described below. Accordingly, an aspect of the disclosure is to provide a display in which a first wiring and a second wiring can be doubly configured in a bending region of a substrate.

Additional aspects will be set forth in part in the description which follows and, in part, will be apparent from the description, or may be learned by practice of the presented embodiments.

In accordance with an aspect of the disclosure, a display is provided. The display includes a pixel layer including a plurality of pixels, a substrate disposed under the pixel layer and including a first area on which the pixel layer is disposed, and a second area extending out of the pixel layer from the first area, at least a partial area of the second area being bendable, wherein the substrate includes: a wiring layer including at least one first wiring electrically connected with at least one pixel of the plurality of pixels, and disposed from the first area to the second area, and at least one second wiring disposed in the at least partial area and electrically connected with the at least one first wiring in the second area.

In accordance with another aspect of the disclosure, a display is provided. The display includes a display panel including a first area (e.g., an active area (AA)) including a plurality of pixels, and a second area including a bendable bending region, at least one first wiring electrically connected with at least one pixel of the plurality of pixels, and disposed on the first area and the bending region of the second area, and at least one second wiring electrically connected with the at least one first wiring in the second area, and disposed on the bending region of the second area.

In accordance with another aspect of the disclosure, a display is provided. The display includes a pixel layer including a plurality of pixel, and a substrate disposed under the pixel layer, including a first area in which the pixel layer is disposed, and a second area extending out of the pixel layer from the first area, and at least a partial area of the second area being bendable, wherein the substrate includes: at least one first wiring electrically connected with first pixels of the plurality of pixels, and disposed from the first area to the second area, and at least one second wiring electrically connected with second pixels different from first pixels electrically connected with the first wiring, and disposed from the first area to the second area.

In accordance with another aspect of the disclosure, a display is provided. The display includes a substrate including a first area and a second area extending from the first area, at least a partial area of the second area being bendable, at least one first wiring disposed from the first area to the second area, at least one second wiring disposed in the at least a partial area of the second area, and electrically connected with the at least one first wiring in the second area, and at least one wiring layer disposed between the at least one first wiring, and the at least one second wiring and separating the at least one first wiring and the at least one second wiring.

In accordance with another aspect of the disclosure, a display is provided. The display includes a substrate including a first area, a second area extending from a first side of the first area, and a third area extending from a second side of the first area, at least a partial area of the second area being bendable, and at least a partial area of the third area being bendable, at least one first wiring disposed from the first side of the first area to the second area, at least one second wiring disposed in the at least a partial area of the second area, and electrically connected with the at least one first wiring in the second area, at least one third wiring disposed from the second side of the first area to the third area, and at least one fourth wiring disposed in the at least a partial area of the third area, and electrically connected with the at least third wiring in the third area.

According to various embodiments, since a first wiring and a second wiring are doubly separated in a bending region of a substrate, it is possible to mitigate interference between a window of an electronic device and the bending region. Further, two wirings that are arranged in parallel in the related art can be disposed to substantially overlap each other on different layers in various embodiments, so the width of the bending region can be reduced.

According to various embodiments, since a first wiring and a second wiring are doubly disposed in a bending region of a substrate, the same wiring can be doubly achieved. Accordingly, even if a crack is generated in at least one of the first wiring and the second wiring, the other wiring can be electrically connected with the display driver integration of an electronic device, so a poor wiring rate of a product can be reduced.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

Figure 1:
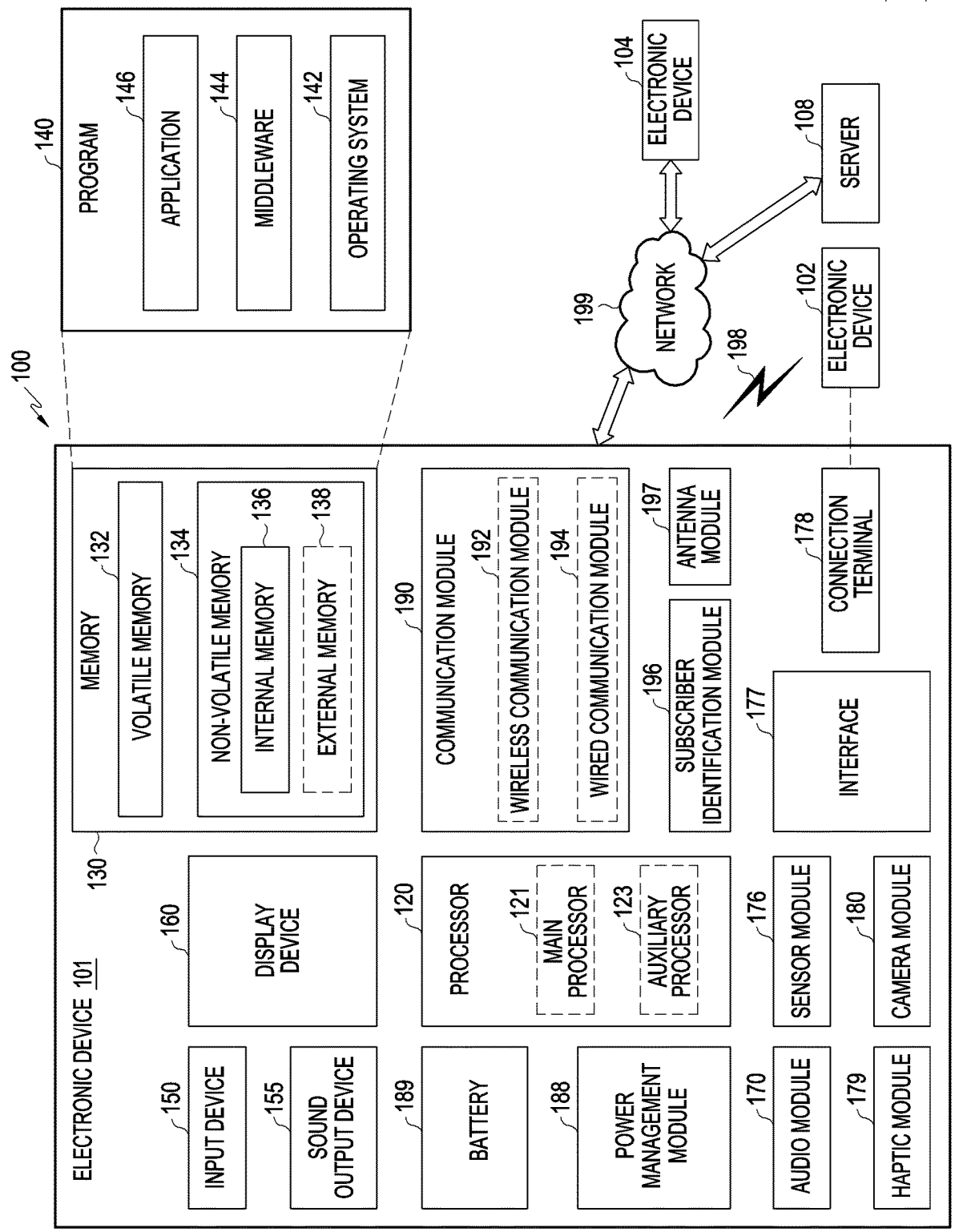
FIG. 1 is a schematic diagram showing an electronic device in a network environment, the electronic device including a plurality of wiring layers on a bending region according to an embodiment of the disclosure.

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

The electronic device according to various embodiments may be one of various types of electronic devices. The electronic devices may include, for example, a portable communication device (e.g., a smart phone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

FIG. 1 is a block diagram illustrating an electronic device 101 in a network environment 100 according to various embodiments according to an embodiment of the disclosure.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an ISP or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by another component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming call. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, ISP, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the AP) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., printed circuit board (PCB)). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

Figure 2A:
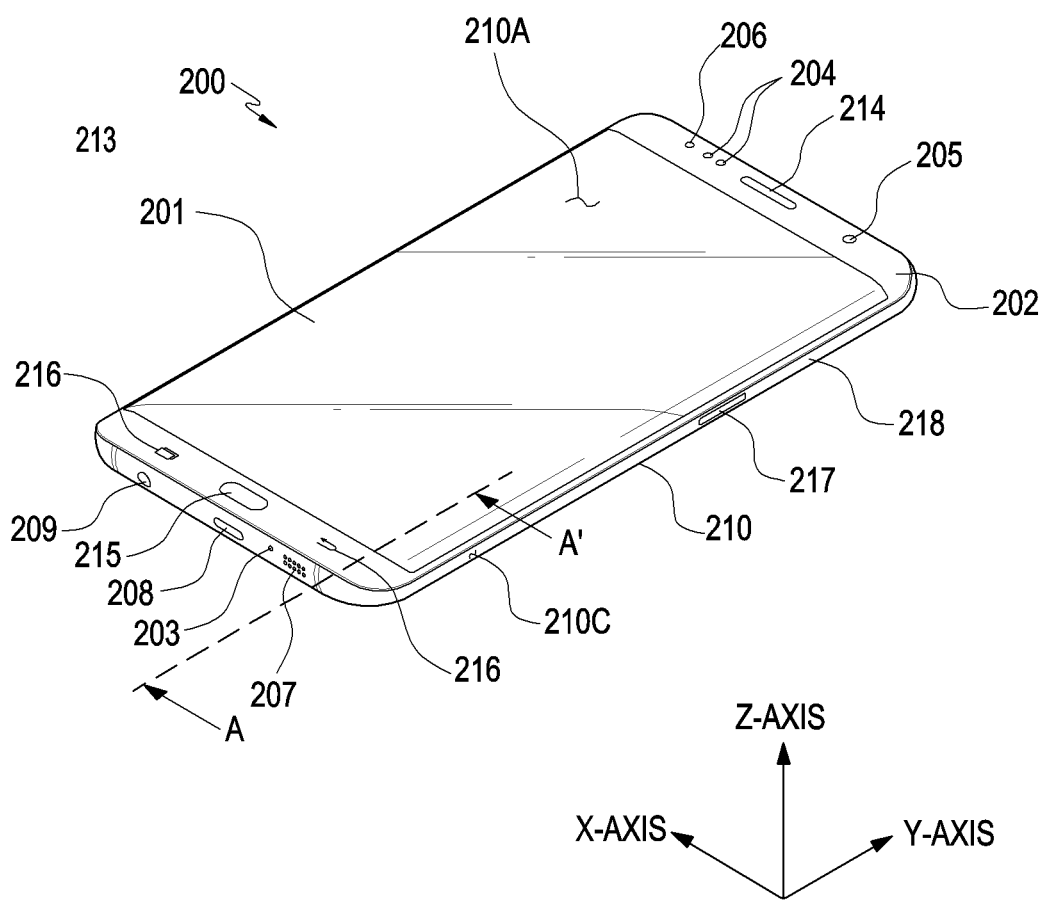
FIG. 2A is a front view showing an electronic device according to an embodiment of the disclosure.

FIG. 2A is a perspective view showing the front surface of an electronic device (e.g., an electronic device 101 shown in FIG. 1) according to an embodiment of the disclosure.

Figure 2B:
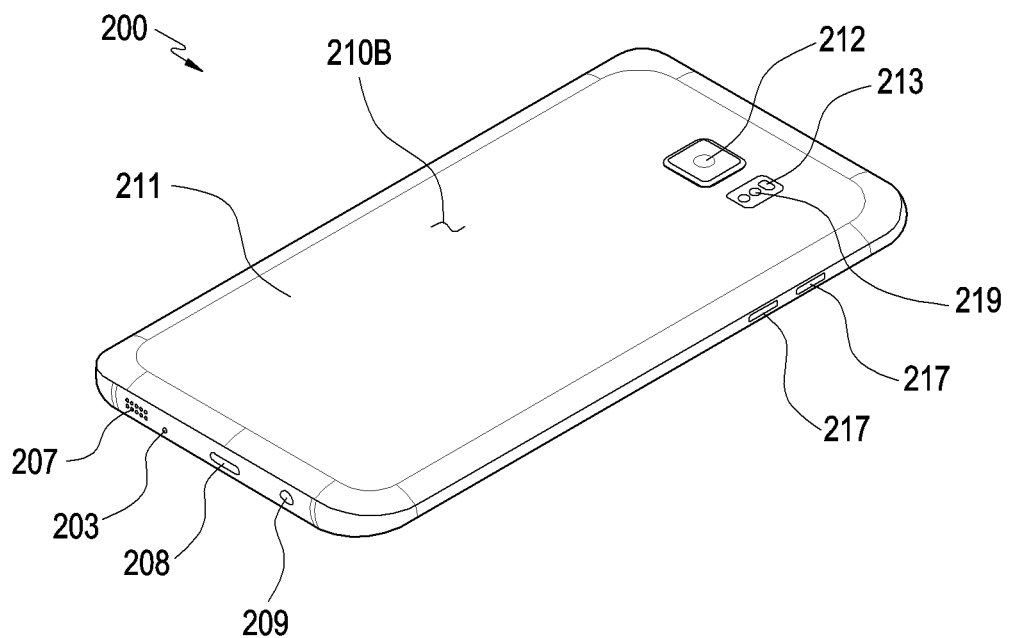
FIG. 2B is a rear view showing the electronic device according to an embodiment of the disclosure.

FIG. 2B is a perspective view showing the rear surface of the electronic device shown in FIG. 2A according to an embodiment of the disclosure.

Figure 2C:
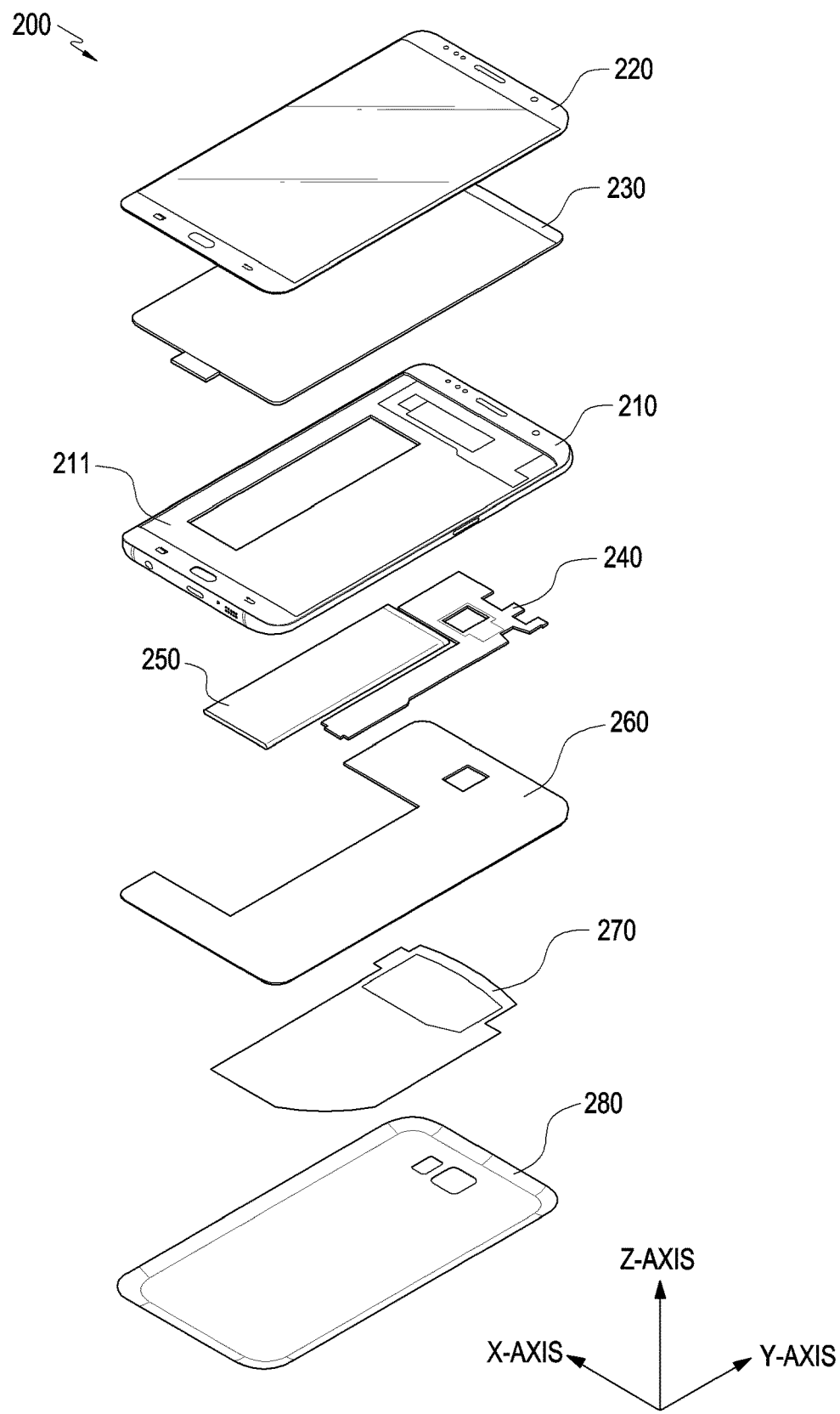
FIG. 2C is an exploded perspective view showing the electronic device according to an embodiment of the disclosure.

FIG. 2C is an expanded perspective view of the electronic device shown in FIG. 2A according to an embodiment of the disclosure.

Referring to FIGS. 2A and 2B, an electronic device 200 according to an embodiment may include a housing 210 having a first surface (or a front surface) 210A, a second surface (or a rear surface) 210B, and a side 210C surrounding the space between the first surface 210A and the second surface 210B. In another embodiment (not shown), the housing may refer to a structure forming some of the first surface 210A, the second surface 210B, and the side 210C shown in FIG. 2A. According to an embodiment, the first surface 210A may be at least partially substantially formed by a transparent front plate 202 (e.g., a glass plate or a polymer plate including various coating layers). The second surface 210B may be formed by a substantially opaque rear plate 211. The rear plate 211, for example, may be made of coated or colored glass, ceramic, a polymer, metal (e.g., aluminum, stainless steel (STS), or magnesium), or a combination thereof. The side 210C is combined with a front plate 202 and a rear plate 211 and may be formed by a lateral bezel structure 218 (or a "lateral member") including metal and/or a polymer. In an embodiment, the rear plate 211 and the lateral bezel structure 218 may be integrated and may include the same material (e.g., a metallic material such as aluminum).

According to an embodiment, the electronic device 200 may include at least one or more of a display 201, a microphone hole 203 and/or speaker holes 207 and 214, sensor modules 204 and 219, camera modules 205, 212, and 213, key input units 215, 216, and 217, an indicator 206, and connector holes 208 and 209. In an embodiment, the electronic device 200 may not include at least one (e.g., the key input units 215, 216, and 217 or the indicator 206) of the components or may further include other components.

The display 201, for example, may be exposed through a large part of the front plate 202. The display 201 may be combined with or disposed adjacent to a touch sensing circuit, a pressure sensor that can measure the intensity (pressure) of a touch, and/or a digitizer that detects a magnetic stylus pen.

A microphone for catching external sounds may be disposed in the microphone hole 203, and in an embodiment, a plurality of microphones may be disposed therein to sense the direction of sounds. The speaker holes 207 and 214 may include an external speaker hole 207 and/or a receiver hole 214 for a telephone call. In an embodiment, the speaker holes 207 and 214 and the microphone hole 203 may be integrated into one hole or a speaker (e.g., 305 in FIGS. 3A through 3C) may be included without the speaker holes 207 and 214.

The sensor modules 204 and 219 can generate electrical signals or data values corresponding to the internal operation state of the electronic device 200 or the external environmental state. The sensor modules 204 and 219, for example, may include a first sensor module 204 (e.g., a proximity sensor) disposed on the first surface 210A of the housing 210, a second sensor module (not shown) (e.g., a fingerprint sensor), and/or a third sensor module 219 (e.g., a heart rate monitor (HRM) sensor) disposed on the second surface 210B of the housing 210. The fingerprint sensor may be disposed not only on the first surface 210A (e.g., a home key button 215), but also on the second surface 210B of the housing 210. The electronic device 200 may further include, for example, at least one of a gesture sensor, a gyro sensor, a barometer sensor, a magnetic sensor, an acceleration sensor, a grip sensor, a color sensor, an IR sensor, a biosensor, a temperature sensor, a humidity sensor, and an illumination sensor, which are not shown in the figures.

The camera modules 205, 212, and 213 may include a first camera module 205 disposed on the first surface 210A of the housing of the electronic device 200, and a second camera 212 and/or a flash 213 disposed on the second surface 210B. The camera modules 205 and 212 may include one or more lenses, an image sensor, and/or an ISP. The flash 213, for example, may include a light emitting diode or a xenon lamp. In an embodiment, two or more lenses (a wide-angle lens and a telephoto lens) and image sensors may be disposed on one surface of the electronic device 200.

The key input units 215, 216, and 217 may include a home key button 215 disposed on the first surface 210A of the housing 210, touch pads 216 disposed around the home key button 215, and/or a side key button 217 disposed on the side 210C of the housing 210. In another embodiment, the electronic device 200 may not include some or all of the key input units 215, 216, and 217 described above and the not-included key input units 215, 216, and 217 may be implemented in other types such as a software key on the display 201.

The indicator 206, for example, may be disposed on the first surface 210A of the housing 210. The indicator 206, for example, can provide state information of the electronic device 200 using an optical type and may include an LED.

The connector holes 208 and 209 may include a first connector hole 208 that can accommodate a connector (e.g., a USB connector) for transmitting and receiving power and/or data to and from external electronic devices and/or a second connector hole 209 (e.g., an earphone jack) that can accommodate a connector for transmitting and receiving audio signals to and from external electronic devices.

Referring to FIG. 2C, the electronic device 200 may include a lateral bezel structure 218, an intermediate plate 280 (e.g., a bracket), a front plate 202, a display 201, a printed circuit board 240, a battery 250, a supporting member 260 (e.g., a rear case), an antenna 270, and a rear plate 211. In an embodiment, the electronic device 200 may not include at least one (e.g., the intermediate plate 280 or the supporting member 260) of the components or may further include other components. At least one of the components of the electronic device 200 may be the same as or similar to at least one of the components of the electronic device 200 shown in FIG. 2A or FIG. 2B and a repeated description is omitted below.

The intermediate plate 280 is disposed in the electronic device 200 and may be connected with the lateral bezel structure 218 or may be integrated with the lateral bezel structure 218. The intermediate plate 280, for example, may be made of a metallic material and/or a non-metallic material (e.g., a polymer). The display 201 may be coupled to a surface of the intermediate plate 280 and the printed circuit board 240 may be coupled to the other surface of the intermediate plate 280. A processor, a memory, and/or an interface may be mounted on the printed circuit board 240. The processor, for example, may include one or more of a CPU, an AP, a graphic processor, an ISP, a sensor hub processor, and a communication processor.

The memory, for example, may include a volatile memory or a nonvolatile memory.

The interface may include a HDMI, a USB interface, an SD card interface, and/or an audio interface. The interface, for example, can electrically or physically connect the electronic device 200 to external electronic devices and may include an USB connector, an SD card/MMC connector, or an audio connector.

The battery 250, which is a device for supplying power to one or more components of the electronic device 200, for example, may include a primary battery that is not rechargeable, a secondary battery that is rechargeable, or a fuel cell. At least a portion of the battery 250, for example, may be disposed in substantially the same plane as the printed circuit board 240. The battery 250 may be integrally disposed in the electronic device 200 and may be detachably attached to the electronic device 200.

The antenna 270 may be disposed between the rear plate 211 and the battery 250. The antenna 270, for example, may include a near field communication (NFC) antenna, a wireless charging antenna, and/or a magnetic secure transmission (MST) antenna. The antenna 270, for example, can perform near field communication with external devices or can wirelessly transmit and receive power for charging. In another embodiment, the antenna may be formed by a portion or a combination of the lateral bezel structure 218 and/or the supporting member 260.

Figure 3A:
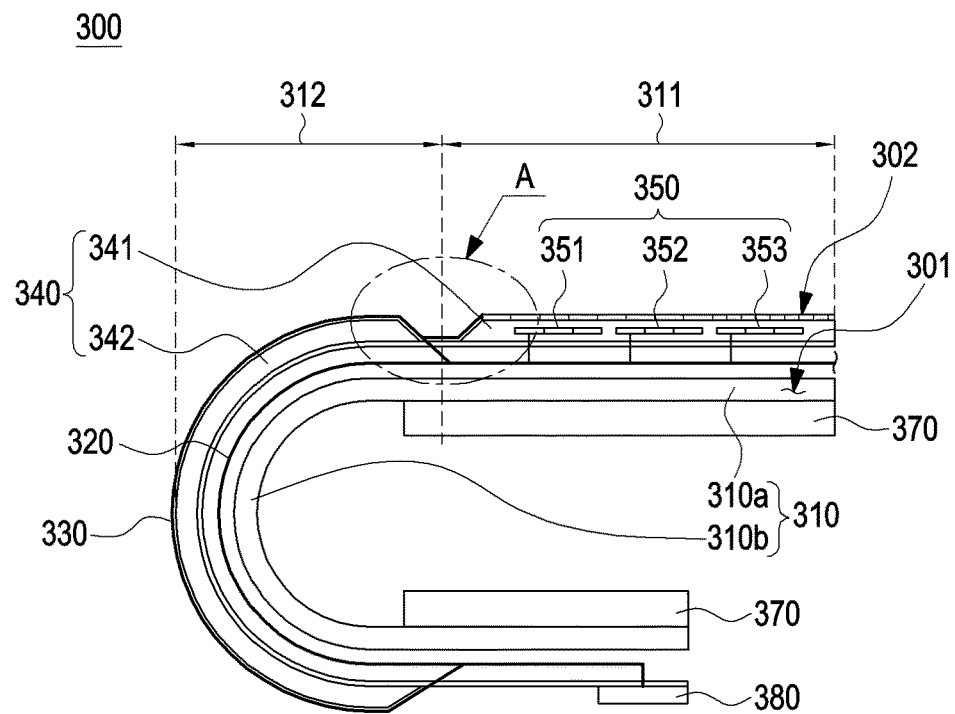
FIG. 3A is a cross-sectional view according to one of various embodiments and taken along line A-A' of FIG. 2A according to an embodiment of the disclosure.

FIG. 3A is a cross-sectional view according one of various embodiments taken along line A-A' shown in FIG. 2A according to an embodiment of the disclosure.

Figure 3B:
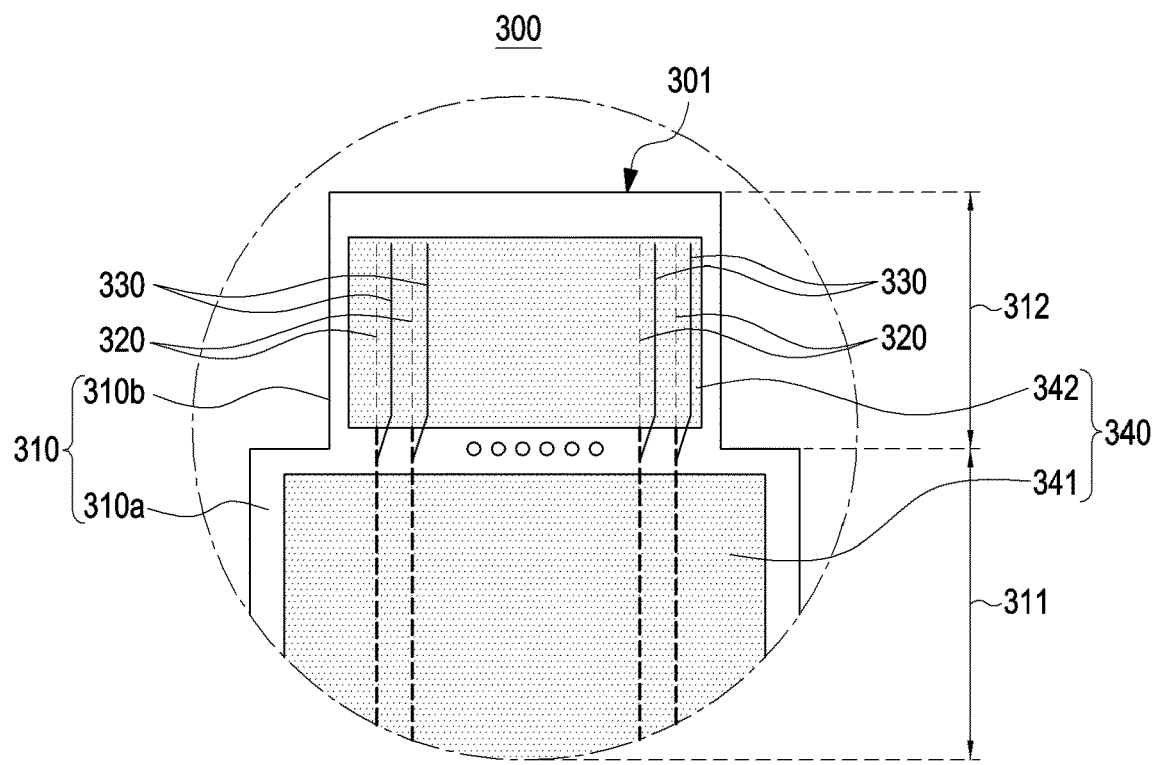
FIG. 3B is an enlarged plan view showing the portion A in FIG. 3A according to an embodiment of the disclosure.

FIG. 3B is an enlarged plan view of the portion A shown in FIG. 3A according to an embodiment of the disclosure.

Referring to FIGS. 3A and 3B, a display 300, according to one of various embodiments, may include a display panel 301 and a touch sensor 302. The display panel 301 may include a substrate 310. For example, the display panel 301 may include an organic light emitting diode (OLED) element.

The substrate 310 may include any one or two or more combinations selected from polycarbonate (PC), polymethyl methacrylate (PMMA), polyimide (PI), polyethylene terephthalate (PET), polypropylene terephthalate (PPT), amorphous polyethylene terephthalate (APET), polyethylene naphthalate terephthalate (PEN), polyethylene terephthalate glycol (PETG), tri-acetyl-cellulose (TAC), cyclic olefin polymer (COP), cyclic olefin copolymer (COC), polydicyclopentadiene (DCPD), cyclopentdienyl anions (CPD), polyarylate (PAR), polyethersulfone (PES), poly ether imide (PEI), and modified epoxy resin or acrylic resin According to an embodiment, the substrate 310 may be made of an inflexible material.

The display panel 301 may be disposed under the touch sensor 302. The display panel 301 is not limited to an OLED and may be various display devices such as an LCD.

A display driver 380 (e.g., a display driver integration (DDI) may be a display driving chip that controls a plurality of pixels 351, 352, 353 of the display 300 to provide various colors.

According to an embodiment, the display driver 380 may be disposed at least one of an end of the display panel 301 and a circuit board (e.g., an M-FPCB) (not shown) included in an electronic device (e.g., 200 in FIG. 2A). The display driver 380 will be described hereafter based on an embodiment in which the display driver 380 is disposed at an end of the display panel 301.

The substrate 310 may be disposed under a pixel layer 350 including the plurality of pixels 351, 352, and 353.

The plurality of pixels 351, 352, and 353 can generate light for outputting images. The plurality of pixels 351, 352, and 353 may be arranged on a first insulating layer 341 of a wiring layer 340.

The substrate 310 includes a first area 311 on which the pixel layer 350 is disposed and a second area 312 extending out of the pixel layer 350 from the first area 311. At least a partial area of the second area 312 may be bendable.

The substrate 310 may include at least one first wiring 320, at least one second wiring 330, or a wiring layer 340.

The at least one first wiring 320 may be electrically connected with the plurality of pixels 351, 352 and 353 and may be disposed from the first area 311 to the second area 312.

The at least one second wiring 330 may be disposed on at least a partial area of the second area 312 and may be electrically connected with the at least one first wiring 320 in the second area 312.

The wiring layer 340 may be disposed between the at least one first wiring 320 and the at least one second wiring 330 to be able to separate the at least one first wiring 320 from the at least one second wiring 330. For example, as shown in FIG. 3A, the first wiring 320 may be disposed on the bottom surface of a first insulating layer 341 and a second insulating layer 342, and the second wiring 330 may be disposed on the top surface of the second insulating layer 342.

According to an embodiment, the substrate 310 may include first and second substrates 310a and 310b. The first substrate 310a may be disposed in the first area 311, the second substrate 310b may be bent at a side of the first area 311 such that a portion of the second substrate 310b (e.g., the portion on which the display driver 380 is mounted) is disposed on the rear surface of the first substrate 310a. The first substrate 310a may be disposed under a plurality of pixels 351, 352 and 353. The second substrate 310b may be bent in at least a partial area of the second area 312. For example, the second substrate 310b may extend and bend from the first substrate 310a.

The at least one first wiring 320 may be disposed on the first and second areas 311 and 312. The at least one first wiring 320 electrically connected with the plurality of pixels 351, 352 and 353. The least one second wiring 330 electrically connected with the at least one first wiring 320 may be disposed on at least a partial area of the second area 312.

The first wiring 320 and second wiring 330 may be disposed on different surfaces of the second insulating layer 342. For example, the first wiring 320 may be disposed on a first surface of the of the second insulating layer 342 and the second wiring 330 may be disposed on a second surface opposite to the first surface of the second insulating layer 342.

The wiring layer 340 may include a first insulating layer 341 and a second insulating layer 342. The first insulating layer 341 may be disposed on the first area 311. The second insulating layer 342 may be disposed on the second area 312. The second insulating layer 342 may separate the first wiring 320 and the second wiring 330 in at least bending regions of the second area 312.

The first insulating layer 341 or the second insulating layer 342 may include at least one of a thin film encapsulation (TFE) layer, a pixel define layer (PDL), and a thin film transistor (TFT) Passivation layer. A TFE layer is exemplified but the first insulating layer 341 or the second insulating layer 342 are not limited thereto. For example, various configurations may be applied to the first insulating layer 341 and the second insulating layer 342 as long as they can provide electrical insulation.

According to an embodiment, at least a portion of the second substrate 310b may be formed in a chip on plastic (COP) structure, which is a bending structure. For example, the COP structure may be formed by further extending some plastic layers in the second substrate 310b, mounting a display driver 380 (e.g., a DDI), and then bending the second substrate 310b. The second substrate 310b can provide the area for mounting the display driver 380 by extending from the first substrate 310a and is deformed in a curved surface shape, whereby the display driver 380 can be disposed on the rear surface of the first substrate 310a. The bent area of the second substrate 310b may have an elliptical or semi-circular cross-section. The display driver 380 for controlling the display panel 301 may be disposed at an end of the second substrate 310b. The display driver 380 may be electrically connected with the plurality of pixels 351, 352 and 353 disposed on the first substrate 310a through the at least one first wiring 320 and the at least one second wiring 330. For example, in an embodiment, the display driver 380 may be set to output display information by controlling the plurality of pixels 351, 352 and 353 disposed on the substrate 310.

According to an embodiment, the display 300 may further include at least one protective film 370. The at least one protective film 370 may be attached to the lower portion of the first substrate 310a or to an end of the second substrate 310b.

As described above, since the at least one first wiring 320 is disposed on the first substrate 310a and the second substrate 310b. the at least one first wiring 320 and the at least one second wiring 330 are separately and doubly disposed in the second area 312 (e.g., a bending region) of the second substrate 310b, it is possible to mitigate a problem (e.g., insulator cracks or breakage of wire) that may occur due to interference between the window (not shown) of an electronic device (e.g., 101 in FIG. 1) and the second area 312 (e.g., the bending region) of the second substrate 310b, and it is also possible to reduce the width of the second area 312 (e.g., the bending region) of the second substrate 310b.

Referring to FIG. 3A stated above, the first wiring 320 and the second wiring 330 may be separately disposed on the bottom and the top of the second insulating layer 342 on the second area 312 of the second substrate 310b. According to an embodiment, since the first wiring 320 and the second wiring 330 are disposed on the bottom and the top of the second insulating layer 342, respectively, the first wiring 320 and the second wiring 330 may face each other in the second area 312 with the second insulating layer 342 therebetween.

According to an embodiment, a width of at least a portion of the second wiring 330 may be greater than a width of at least a portion of the first wiring 320.

Figure 3C:
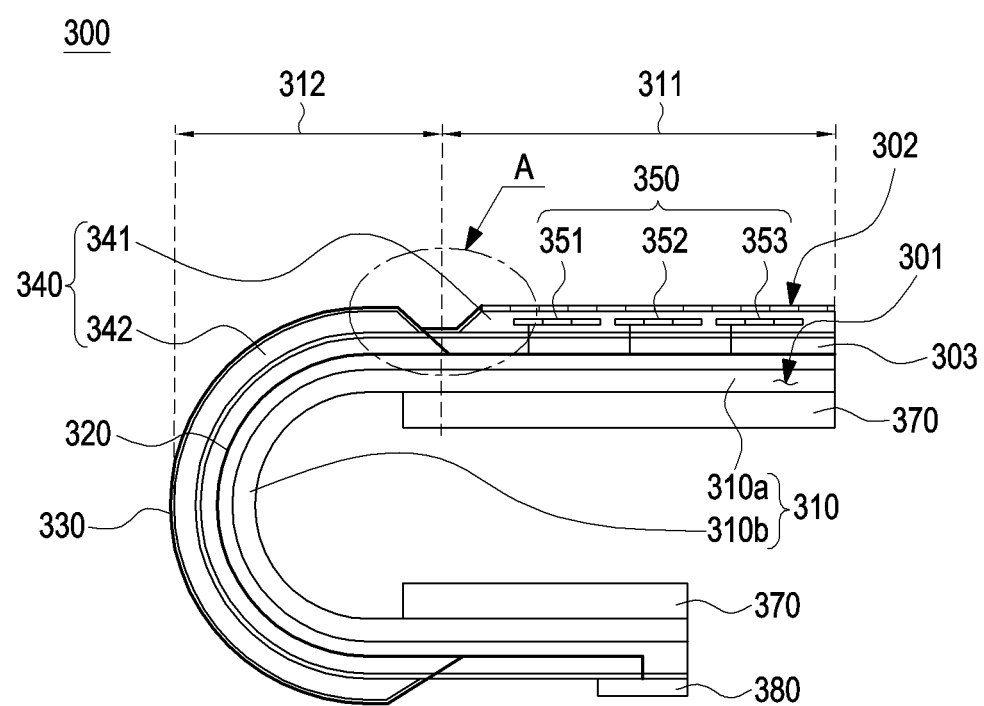
FIG. 3C is a cross-sectional view showing a display including a thin film transistor (TFT) layer according to one of various embodiments and taken along line A-A' of FIG. 2A according to an embodiment of the disclosure.

FIG. 3C is a cross-sectional view showing a display including a TFT layer, according to one of various embodiments, and taken along line A-A' of FIG. 2A according to an embodiment of the disclosure.

Referring to FIG. 3C, a display 300, according to one of various embodiments, may include a display panel 301, a touch sensor 302 and a TFT layer 303, the display panel 301 may include a substrate 310. For example, the display panel 301 may include an organic light emitting diode (OLED) element. At least one of the components of the display 300 including the TFT layer 303 may be the same as or similar to at least one of the components of the display 300 shown in FIG. 3A or FIG. 3B and a repeated description is omitted below.

The display driver 380 (e.g., a DDI) may be a display driving chip that controls the pixels 351, 352 and 353 of the display 300 to generate various colors.

The substrate 310 may be disposed under the pixel layer 350 including the plurality of pixels 351, 352 and 353 and may include a second area 312 extending out of the pixel layer 350 from a first area 311 on which the pixel layer 350 is disposed, and at least a partial area of the second area 312 may being bendable.

The display 300 may include at least one first wiring 320, at least one second wiring 330, and a wiring layer 340.

The at least one first wiring 320 may be electrically connected with the plurality of pixels 351, 352 and 353 and may be disposed from the first area 311 to the second area 312.

The at least one second wiring 330 may be disposed on at least a partial area of the second area 312 and may be electrically connected with the at least one first wiring 320 in the second area 312.

The wiring layer 340 may be disposed between the at least one first wiring 320 and the at least one second wiring 330 to be able to separate the at least one first wiring 320 and the at least one second wiring 330. For example, as shown in FIG. 3C, the at least one first wiring 320 may be disposed on the bottom surface of a first insulating layer 341 and a second insulating layer 342 and the at least one second wiring 330 may be disposed on the top surface of the second insulating layer 342.

The TFT layer 303 may be disposed between the first and second insulating layers 341 and 342 and the substrate 310. At least a portion of the TFT layer 303 may be disposed on the first area 311 and the second area 312. The at least one first wiring 320 may be disposed in the TFT layer 303.

The at least one first wiring 320 may be disposed on the first area 311 and the second area 312. the second wiring 330 may be separately disposed on the bottom and the top of the second insulating layer 342, respectively, in the second area 312. According to an embodiment, since the first wiring 320 and the second wiring 330 are disposed on the bottom and the top of the second insulating layer 342, respectively, the at least one first wiring 320 and the at least one second wiring 330 may face each other in the second area 312 with the second insulating layer 342 therebetween.

According to an embodiment, at least one of the components of the touch sensor 302 shown in FIG. 3C may be the same as or similar to at least one of the components of the touch sensor 302 shown in FIG. 3A or 3B, and a repeated description is omitted.

Figure 4:
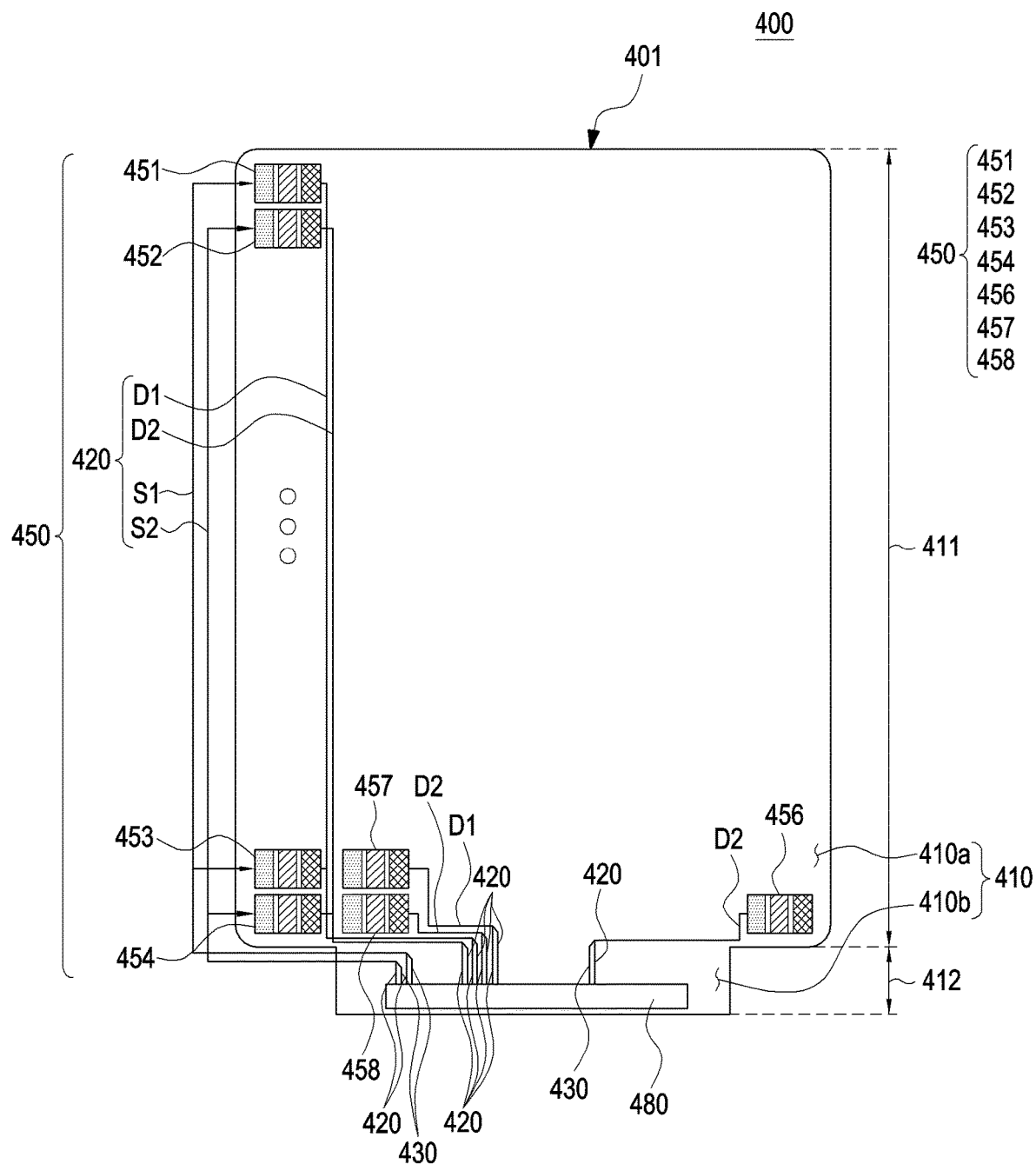
FIG. 4 is a plan view showing a display according to an embodiment of the disclosure.

FIG. 4 is a plan view showing a display according to an embodiment of the disclosure.

Referring to FIG. 4, a display 400 may include a display panel 401 and a pixel layer including a plurality of pixels 451, 452, 453, 454, 456, 457 and 458 (collectively pixels 450). For example, a display panel 401 may include a substrate 410. the substrate 410 may include a first substrate 410a and a second substrate 410b.

The first substrate 410a may be disposed under the plurality pixels 451, 452, 453, 454, 456, 457 and 458 and the first substrate 410a may be disposed on a first area 411. The second substrate 410b may disposed on a second area 412 extending out of the plurality pixels 451, 452, 453, 454, 456, 457 and 458 from a first area 411, and at least a partial area of the second area 412 may being bendable.

The display panel 401 may include at least one first wiring and at least one second wiring 430 and a wiring layer (e.g., 340 in FIG. 3A).

The at least one first wiring 420 may be electrically connected with the pixels of the plurality of pixels 451, 452, 453, 454, 456, 457 and 458 and may be disposed from the first area 411 to the second area 412.

The at least one second wiring 430 may be disposed on at least a partial area of the second area 412 and may be electrically connected with the at least one first wiring 420 on the second area 412.

According to an embodiment, at least a portion of the second substrate 410b may be formed in a COP structure, which is a bending structure. For example, the COP structure may be formed by further extending some plastic layers in the second substrate 410b, mounting a display driver 480 (e.g., a DDI), and then bending the second substrate 410b. The second substrate 410b can provide the area for mounting the display driver 480 by extending from the first substrate 410a and is deformed in a curved surface shape, whereby the display driver 380 can be disposed on the rear surface of the first substrate 410a. The bent area of the second substrate 410b may have an elliptical or semicircular cross-section. The display driver 480 for controlling the display panel 401 may be disposed at an end of the second substrate 410b. The display driver 480 may be electrically connected with the plurality of pixels 451, 452, 453, 454, 456, 457 and 458 disposed on the first substrate 410a through the at least one first wiring 420 and the at least one second wiring 430. For example, in an embodiment, the display driver 480 may be set to output display information by controlling the plurality of pixels 451, 452, 453, 454, 456, 457 and 458 disposed on the substrate 410.

The at least one data line D1, D2 may include a first data line D1 or a second data line D2. For example, the first data line D1 may be electrically connected with at least some pixels 451, 453, and 457 disposed at odd-numbered positions of the plurality of pixels 451, 452, 453, 454, 456, 457 and 458, and the second data line D2 may be electrically connected with at least some pixels 452, 454, 456 and 458 disposed at even-numbered positions of the plurality of pixels 451, 452, 453, 454, 456, 457 and 458.

The at least one scan line S1, S2 may include a first scan line S1 or a second scan line S2. For example, the first scan line S1 may be electrically connected with at least some odd-numbered pixels 451, 453, and 457 disposed at odd-numbered positions of the plurality of pixels 451, 452, 453, 454, 456, 457 and 458 and the second scan line S2 may be electrically connected with at least some even-numbered pixel layers 452, 454, 456 and 458 disposed at even-numbered positions of the plurality of pixels 451, 452, 453, 454, 456, 457 and 458.

The wire layer (e.g., 340 in FIG. 3A) may include a first insulating layer (e.g., 341 in FIG. 3A) and a second insulating layer (e.g., 342 in FIG. 3A). The first data line D1, the second data line D2, the first scan line S1, and the second scan line S2 may dispose under the first insulating layer (e.g., 341 in FIG. 3A) The second insulating layer (e.g., 342 in FIG. 3A) may separate the first data line D1 and the second data line D2 in at least a bending region of a second area (e.g., 312 in FIG. 3A). Further, the second insulating layer (e.g., 342 in FIG. 3A) may separate the first scan line S1 and the second scan line S2 in at least the bending region of the second area (e.g., 312 in FIG. 3A).

According to an embodiment, the data lines, the first data line D1 of the at least one data line D1, D2 can be electrically connected with at least some odd-numbered pixels 451, 453, and 457 disposed at odd-numbered positions of the plurality of pixels 451, 452, 453, 454, 456, 457 and 458 and the second data line D2 of the at least one data line D1, D2 can be electrically connected with at least even-numbered pixels 452, 454, 456 and 458 disposed at even-numbered positions of the plurality of pixels 451, 452, 453, 454, 456, 457 and 458.

According to an embodiment, the scan lines, the first scan line S1 of the at least one scan line S1, S2 can be electrically connected with at least some odd-numbered pixel layers 451, 453, and 457 disposed at odd-numbered positions of the plurality of pixels 451, 452, 453, 454, 456, 457 and 458 and the second scan line S2 of the at least one scan line S1, S2 can be electrically connected with at least even-numbered pixels 452, 454, 456 and 458 disposed at even-numbered positions of the plurality of pixels 451, 452, 453, 454, 456, 457 and 458.

For example, the at least one data line D1, D2 and the at least one scan line S1, S2 can separately connect the plurality of pixels 451, 452, 453, 454, 456, 457 and 458 in accordance with the arranged positions (e.g., odd-numbered positions or even-numbered positions) without connecting all the plurality of pixels 451, 452, 453, 454, 456, 457 and 458 regardless of the arranged positions. Accordingly, it is possible to reduce the at least one data line D1, D2 and the at least one scan line S1, S2.

Figure 5:
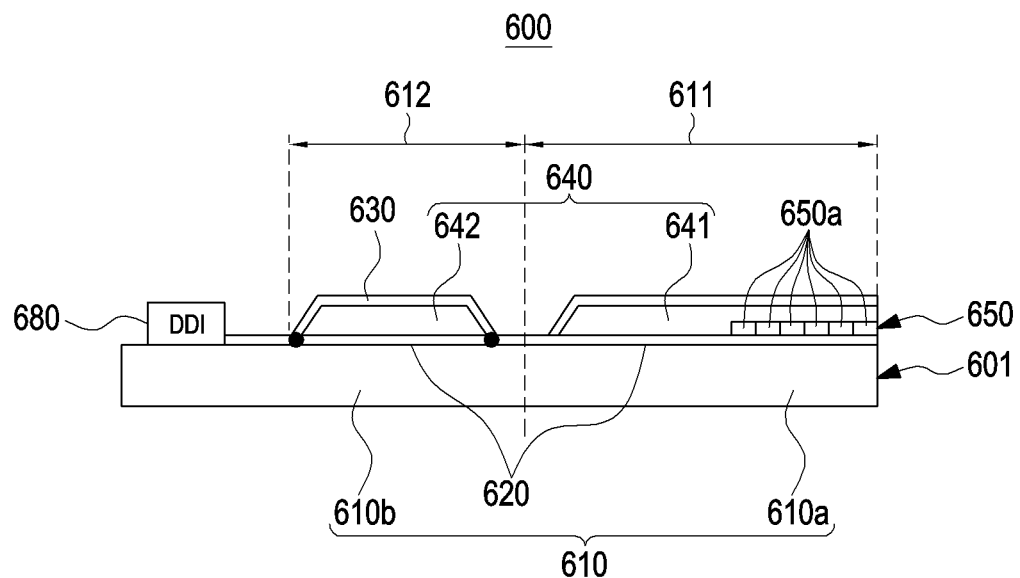
FIG. 5 is a lateral cross-sectional view showing a state before a display according to other various embodiments is bent according to an embodiment of the disclosure.

FIG. 5 is a lateral cross-sectional view showing a state before a display 600 according to other various embodiments is bent according to an embodiment of the disclosure.

Referring to FIG. 5, the display 600 may include a display panel 601. The display panel 601 may include a substrate 610. A pixel layer 650 including a plurality of pixels 650a. A first area 611, a second area 612, a first wiring 620, a second wiring 630, a wiring layer 640, and a display driver 680 (e.g., a DDI) may be disposed on the substrate 610. For example, the second wiring 630 may extend from the first wiring 620 at a first position, for example, a bending start position of the second area 612. The second wiring 630 may be separated from the first wiring 620 forming a dual structure between the first position and a second position of the second area 612. The second wiring 630 may be electrically connected back to the first wiring 620 at the second position, for example, a bending end position of the second area 612. For example, in the first area 611, the first wiring 620 and the first insulating layer 641 are disposed, and, in the second area 612, the first wiring 620 and the second wiring 630 may be separated and doubly disposed with the second insulating layer 642 therebetween. Accordingly, even if any one of the first wiring 620 and the second wiring 630 is cut by a crack, electric connection with the display driver 680 can be maintained through the other wiring, so the display 600 can be operated. Accordingly, it is possible to not only reduce wiring problems of the display 600, but also reduce display malfunctions. The pixel layer 650 may be disposed under the first insulating layer 641.

According to an embodiment, the substrate 610 may include a first substrate 610a and a second substrate 610b, and the first substrate 610a and the second substrate 610b can be easily understood through the embodiments described above, so they are not described in detail.

The first wiring 620 or the second wiring 630 are doubly disposed in the second area 612 (e.g., a bending region) of the second substrate 610b while separated with each other, so it is possible to mitigate a problem (e.g., insulator cracks or breakage of wire) that may occur due to interference between a window (not shown) of an electronic device (e.g. 101 in FIG. 1) and the second area 612 (e.g., the bending region) of the second substrate 610b and it is also possible to reduce the width of the second area 612 (e.g., the bending region) of the second substrate 610b.

Figure 6:
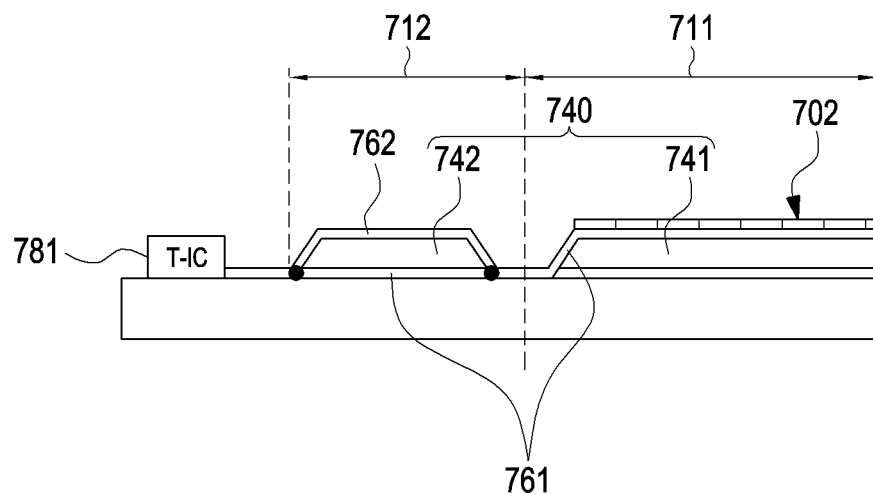
FIG. 6 is a lateral cross-sectional view showing a state before a TFT layer according to other various embodiments is bent according to an embodiment of the disclosure.

FIG. 6 is a lateral cross-sectional view showing a state before a touch sensor 702, according to an embodiment of the disclosure.

Referring to FIG. 6, the display may include the touch sensor 702, at least one first wiring 761, at least one second wiring 762, a wiring layer 740, or a touch sensor driver IC (T-IC) 781. The touch sensor 702 may be electrically connected at least one first wiring 761, at least one second wiring 762. The at least one first wiring 761 may be disposed in a first area 711 and a second area 712. The at least one second wiring 762 may be disposed in the second area 712. The second area 712 may being bendable.

For example, the at least one second wiring 762 may be separated in an electrically connected state at a first position of the second area 712, for example, at a bending start position of the second area 712. The second wiring 762 may be separated by a second insulating layer 742, between the first position and a second position of the second area 712, for example, at a bending end position of the second area 712. The second wiring 762 may be electrically connected back to the at least one first wiring 761 into one wiring at the second position of the second area 712, for example, the bending end position of the second area 712. For example, the wiring layer 740 may include a first insulating layer 741 and a second insulating layer 742. The first wiring 761 and the first insulating layer 741 may be disposed in the first area 711. The first wiring 761 and the second wiring 762 may be separated by the second insulating layer 742 of the wiring layer 740 and doubly disposed in a dual structure in the second area 712. Accordingly, even if the first wiring 761, that is, one of the first wiring 761 and the second wiring 762, for example, the first wiring 761, is cut by a crack, the other wiring, for example, the second wiring 762 can electrically connect the T-IC 781 and the touch sensor 702. Accordingly, wiring problems, such as a disconnection, for the touch sensor 702 can be reduced.

A plurality of electrodes (not shown) included in the touch sensor 702 may be disposed on the top of the first insulating layer 741.

As described above, since the at least one first wiring 761 and the at least one second wiring 762 are separately by the second insulating layer 742 and doubly disposed in a dual structure in the second area 712 (e.g., a bending region) of the touch sensor 702, it is possible to mitigate a problem (e.g., insulator cracks or breakage of wire) that may occur due to interference between a window (not shown) of an electronic device (e.g., 101 in FIG. 1) and the second area 712 (e.g., the bending region) of the touch sensor 702 and it is also possible to reduce the width of the second area 712 (e.g., the bending region) of the touch sensor 702.

Figure 7:
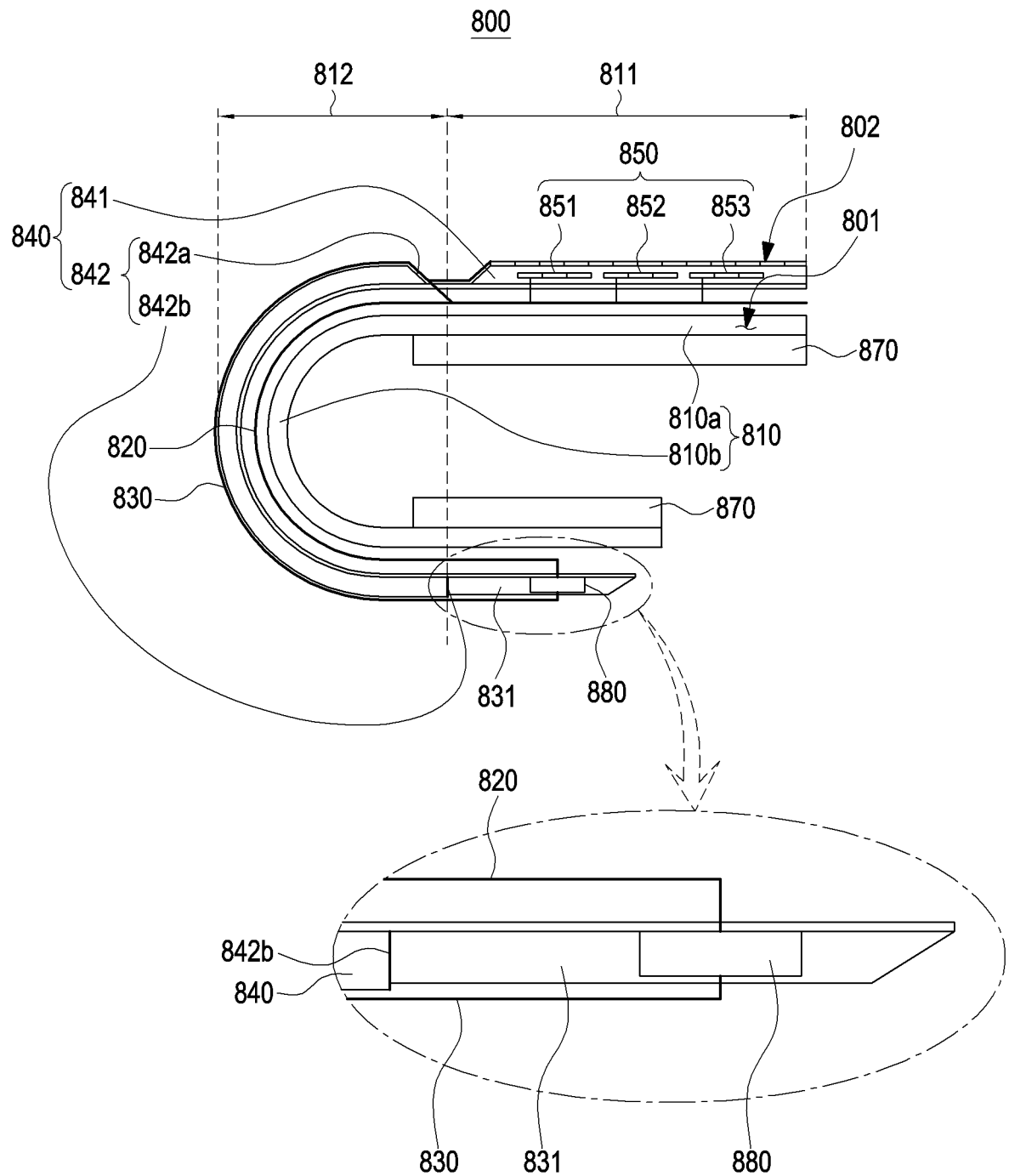
FIG. 7 is a lateral cross-sectional view showing another embodiment of a wiring layer of a display according to an embodiment of the disclosure.

FIG. 7 is a lateral cross-sectional view showing another embodiment of a wiring layer 840 of a display 800 according to an embodiment of the disclosure.

Referring to FIG. 7, a display 800, according to one of various embodiments, may include a display panel 801, a touch sensor 802. A pixel layer 850 including a plurality of pixels 851, 852 and 853. The display panel 801 may include a substrate 810. The substrate 810 may be disposed under the pixel layer 850 and may include a first area 811 on which the pixel layer 850 is disposed and a second area 812 extending out of the pixel layer 850 from the first area 811. At least a partial area of the second area 812 may being bendable. The display 800 may include at least one first wiring 820, at least one second wiring 830, or at least one wiring layer 840. The at least one first wiring 820 may be electrically connected with the plurality of pixels 851, 852 and 853 and may be extended from the first area 811 to the second area 812. The least one second wiring 830 electrically connected with the at least one first wiring 820 may be disposed on at least a partial area of the second area 812.

According to an embodiment, the substrate 810 may include first and second substrates 810a and 810b. The first substrate 810a may be disposed in the first area 311, the second substrate 310b may be bent at a side of the first area 811 such that a portion of the second substrate 810b (e.g., the portion on which the display driver 880 is mounted) is disposed on the rear surface of the first substrate 810a. The first substrate 810*a* may be disposed under a plurality of pixels 851, 852 and 853. The second substrate 810*b* may be bent in at least a partial area of the second area 812. For example, the second substrate 810*b* may extend and bend from the first substrate 810*a*.

According to an embodiment, the display 801 may further include at least one protective film 870. The at least one protective film 870 may be attached to the lower portion of the first substrate 810*a* or to an end of the second substrate 810*b*.

The substrate 810, the first area 811, the second area 812, the at least one first wiring 820, and the at least one second wiring 830 can be easily understood through the embodiments described above, so a repeated description is omitted.

The at least one wiring layer 840 includes a first insulating layer 841 and a second insulating layer 842. The pixel layer 850 may be disposed on the first insulating layer 841.

The second insulating layer 842 may be disposed between the at least one first wiring 820 and the at least one second wiring 830 to be able to separate the at least one first wiring 820 and the at least one second wiring 830.

The second insulating layer 842 may include a wiring extension 831 extending from the second area 812 and covering the display driver 880 (e.g., a DDI) of the display 800. For example, the second insulating layer 842 may include a start position 842*a* and an end position 842*b*.

The wiring extension 831 can extend from the end position 842*b* of the second insulating layer 842 and can cover the display driver 880.

The display driver 880 (e.g., a DDI) may generate noise due to interference with at least one part (e.g., an antenna) of an electronic device (e.g., 101 in FIG. 1) disposed adjacent to the display driver 880, so the operation of the display driver 880 may be hindered.

Accordingly, in an embodiment, the wiring extension 831 covering the display driver 880 (e.g., a DDI) is configured to mitigate noise, so it is possible to not only mitigate noise due to interference with the at least one part (e.g., an antenna) when an electronic device (101 in FIG. 1) operates, but also improve the performance and strength of the display driver 880 (e.g., a DDI).

According to an embodiment, the wiring extension 831 may include a ground layer to increase the effect of mitigating noise due to the at least one part (e.g., an antenna).

Figure 8:
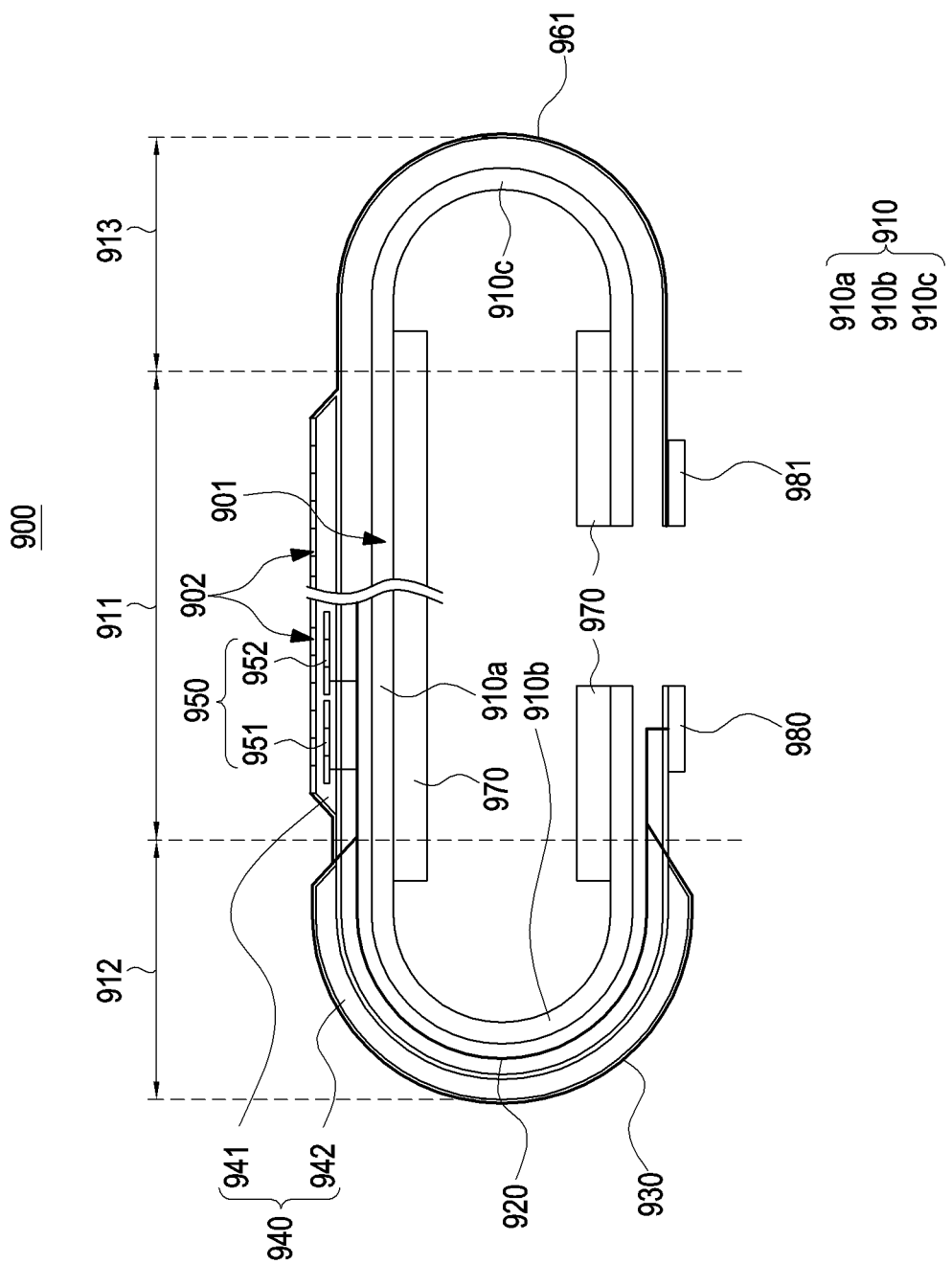
FIG. 8 is a lateral cross-sectional view showing a display according to an embodiment of the disclosure.

FIG. 8 is a lateral cross-sectional view showing a display 900 according to an embodiment of the disclosure.

Referring to FIG. 8, the display 900, according to one of various embodiments, may include a display panel 901, a touch sensor 902. A pixel layer 950 including a plurality of pixels 951, 952. The display panel 901 may include a substrate 910.

The substrate 910 may include a first substrate 910*a*, a second substrate 910*b*, and a third substrate 910*c*.

The first substrate 910*a* may be disposed under the pixel layer 950.

The second substrate 910*b* may be disposed at a first side of the first substrate 910*a* and may disposed on a second area 912 extending out of the pixel layer 950 from the first side of the first area 911 in which the pixel layer 950 is disposed, and at least a partial area of the second area 912 may being bendable.

The third substrate 910*c* may be disposed at a second side of the first substrate 910*a* and may disposed on a third area 913 extending out of the pixel layer 950 from the second side of the first area 911 in which the pixel layer 950 is disposed, and at least a partial area of the third area 913 may being bendable.

The second area 912 and the third area 913 may extend and bend from the first side and the second side of the first area 911, respectively.

The second substrate 910*b* disposed on the second area 912 may include at least one first wiring 920 and at least one second wiring 930.

The at least one first wiring 920 may be electrically connected with the plurality of pixels 951, 952 and may be disposed on the first area 911 and the second area 912.

The at least one second wiring 930 may be electrically connected with the at least one first wiring 920 on the second area 912.

A wiring layer 940 may be disposed between the at least one first wiring 920 and the at least one second wiring 930 to be able to separate the at least one first wiring 920 and the at least second wiring 930.

The wiring layer 940 may include a first insulating layer 941 and a second insulating layer 942. The first insulating layer 941 may be disposed on the first area 911, and the second insulating layer 942 may be disposed on the second area 912. The second insulating layer 942 may separate the first at least one wiring 920 and the at least one second wiring 930 at least in a bending region of the second area 912. The pixel layer 950 may be disposed in the first insulating layer 941.

According to an embodiment, the second substrate 910*b* and the third substrate 910*c* may be formed in the COP structure, which is a bendable structure. For example, the second substrate 910*b* and third substrate 910*c* may have an elliptical or semicircular cross-section. A display driver 980 (e.g., a DDI) for controlling the plurality of pixels 951, 952 may be disposed at an end of the second substrate 910*b*. The display driver 980 may be electrically connected with the plurality of pixels 951, 952 disposed on the first substrate 910*a* through the first wiring 920 and the second wiring 930. For example, in an embodiment, the display driver 980 may be set to provide display information by controlling the pixels 951, 952 disposed on the first substrate 910*a*.

According to an embodiment, the touch sensor 902 may be disposed on the top of the first insulating layer 941 and may be disposed on the first area 911. The touch sensor 902 may include a plurality of electrodes (not shown). At least one wiring 961 electrically connected with the plurality of electrodes of the touch sensor 902 may be disposed on the third area 913.

According to an embodiment, the display 901 may further include at least one protective film 970. The at least one protective film 970 may be attached to the lower portion of the first substrate 910*a* or to an end of the second substrate 910*b*.

According to an embodiment, a T-IC 981 for controlling the touch sensor 902 may be disposed at an end of the at least one wiring 961. The T-IC 981 may be electrically connected with the plurality of electrodes of the touch sensor 902 through the at least one wiring 961. For example, a plurality of first electrodes and second electrodes of the touch sensor 902 can generate electrical signals through a touch input on a window (not shown) of an electronic device (e.g., 101 in FIG. 1). The electrical signals generated by the plurality of first electrodes and second electrodes of the touch sensor 902 can be sensed through the T-IC (e.g., 981 in FIG. 981). The T-IC (981 in FIG. 981) can transmit the sensed signals to a processor (e.g., 120 in FIG. 1) of an electronic device (e.g., 101 in FIG. 1) and the processor (e.g., 120 in FIG. 1) can display the sensed signals through the display 900.

As described above, the second substrate 910*b* or the third substrate 910*c* may be disposed on a second area 912 or a third area 913, respectively. The touch sensor 902 disposed on the top of the first insulating layer 941 may be disposed in the first area 911, and at the least one wiring 961 electrically connected with the plurality of electrodes of the touch sensor 902 may be disposed in the third area 913.

According to an embodiment, since the at least one first wiring 920 and the at least one second wiring 930 may be separately and doubly disposed in the second area (e.g., a bending region) of the second substrate 910*b*, it is possible to mitigate a problem (e.g., insulator cracks or breakage of wire) that may occur due to interference between a window (not shown) of an electronic device (e.g., 101 in FIG. 1) and the second area (e.g., the bending region) of the second substrate 910*b* and to reduce the width of the second area (e.g., the bending region) of the second substrate 910*b*. Since the at least one wiring 961 of the touch sensor 902 is disposed in the third area 913, it is possible to mitigate interference between a window (not shown) of an electronic device (e.g., 101 in FIG. 1) and the third area 913 (e.g., a bending region) and to reduce the width of the third area 913 (e.g., the bending region).

Figure 9:
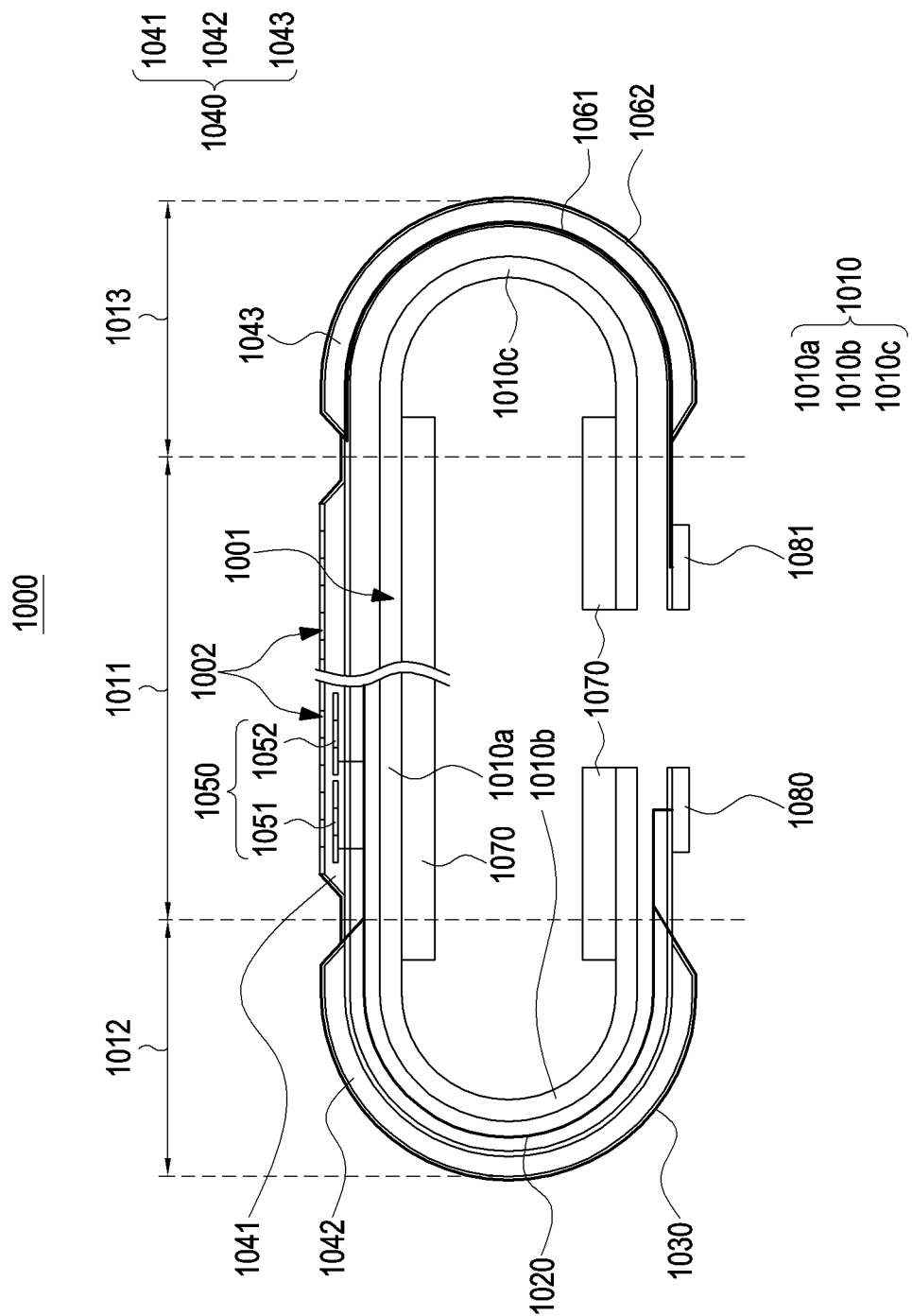
FIG. 9 is a lateral cross-sectional view showing a display according to an embodiment of the disclosure.

FIG. 9 is a lateral cross-sectional view showing a display 1000 according to an embodiment of the disclosure.

Referring to FIG. 9, the display 1000, according to one of various embodiments, may include a display panel 1001, a touch sensor 1002, and a pixel layer 1050 including a plurality of pixels 1051, 1052. The display panel 1001 may include a substrate 1010.

The substrate 1010 may include a first substrate 1010*a*, a second substrate 1010*b*, and a third substrate 1010*c*.

The pixel layer 1050 may be disposed over the first substrate 1010*a*.

The second substrate 1010*b* may be disposed at a first side of the first substrate 1010*a* and may include a second area 1012 extending out of the pixel layer 1050 from the first side of the first area 1011 on which the pixel layer 1050 is disposed, and at least a partial area of the second area 1012 may being bendable.

The third substrate 1010*c* may be disposed at a second side of the first substrate 1010*a* and may include a third area 1013 extending out of the pixel layer 1050 from the second side of the first area 1011 on which the pixel layer 1050 is disposed, and at least a partial area of the third area 1013 may being bendable.

The second area 1012 or the third area 1013 may extend and bend from the first side or the second side of the first area 1011, respectively. For example, the second area 1012 may extend from a first side of the first area 1011 and the third area 1013 may extend from a second side of the first area 1011.

The second substrate 1010*b* disposed on the second area 1012 may include at least one first wiring 1020 and at least one second wiring 1030.

The at least one first wiring 1020 may be electrically connected with at least some pixels of the plurality of pixels 1050*a* and may be extended from the first side of the first area 1011 to the second area 1012.

The at least one second wiring 1030 may be electrically connected with the at least one first wiring 1020 on the second area 1012 while separated with the at least one first wiring 1020 by a second insulating layer 1042.

At least one wiring layer 1040 may be disposed on the first area 1011, the second area 1012, and the third area 1013. The wiring layer 1040 may include a first insulating layer 1041, the second insulating layer 1042, and a third insulating layer 1043. The first insulating layer 1041 may be disposed on the first area 1011 and the second insulating layer 1042 may be disposed on the second area 1012 and may separate the at least one first wiring 1020 and the at least one second wiring 1030. The third insulating layer 1043 may be disposed on the third area 1013 and may separate at least one third wiring 1061 and a at least one fourth wiring 1062, which are to be described below. The pixel layer 1050 may be disposed in the first insulating layer 1041.

According to an embodiment, the second substrate 1010*b* and the third substrate 1010*c* may be formed in the COP structure, which is a bendable structure. For example, the bent second substrate 1010*b* and third substrate 1010*c* may have an elliptical or semicircular cross-section. A display driver 1080 (e.g., a DDI) for controlling the display panel 1001 may be disposed at an end of the second substrate 1010*b*. The display driver 1080 (e.g., a DDI) may be electrically connected with the plurality of pixels 1051, 1052, included in the first area 1011 through the at least one first wiring 1020 and the at least one second wiring 1030. For example, in an embodiment, the display driver 1080 may be set to provide display information by controlling the pixels 1050*a* included in the first substrate 1010*a*.

According to an embodiment, a plurality of electrodes (not shown) may be disposed on the touch sensor 1002 and may be disposed on the first area 1011. The touch sensor 1002 may include the plurality of electrodes (not shown). At least a partial area of the third area 1013 may be bendable.

The second area 1012 or third area 1013 may extend and bend from the first side and the second side of the first area 1011, respectively.

The third area 1013 may include the at least one third wiring 1061 and the fourth wiring 1062.

The at least third wiring 1061 may be electrically connected with the plurality of electrodes (not shown) and may be connected from the first area 1011 to the third area 1013.

The at least one fourth wiring 1062 may be electrically connected with the at least one third wiring 1061 in the third area 1013.

A third insulating layer 1043 may be disposed between the at least one third wiring 1061 and the at least one fourth wiring 1062 to be able to separate the at least one third wiring 1061 and the at least fourth wiring 1062.

According to an embodiment, the display 1001 may further include at least one protective film 1070. The at least one protective film 1070 may be attached to the lower portion of the first substrate 1010*a* or to an end of the second substrate 1010*b*.

According to an embodiment, a T-IC 1081 for controlling the touch sensor 1002 may be disposed at an end of at least one the third wiring 1061. The T-IC 1081 may be electrically connected with the plurality of electrodes (not shown) of the touch sensor 1002 through the third wiring 1061 and the at least one fourth wiring 1062. For example, the plurality of electrodes (not shown) can generate electrical signals through a touch input on a window (not shown) of an electronic device (e.g., 101 in FIG. 1). The electrical signals generated by the plurality of electrodes (not shown) can be sensed by the T-IC 1081 through the at least one third wiring 1061 and the fourth wiring 1062. The T-IC 1081 can transmit the sensed signals to a processor (e.g., 120 in FIG. 1) of an electronic device (e.g., 101 in FIG. 1) and the processor (e.g., 120 in FIG. 1) can display the sensed signals through the display 1000.

As described above, since the at least one first wiring 1020 and the at least one second wiring 1030 may be separately and doubly disposed in the second area 1012 (e.g., a bending region) of the second substrate 1010*b*, it is possible to mitigate interference between a window (not shown) of an electronic device (e.g., 101 in FIG. 1) and the second area (e.g., the bending region) of the second substrate 1010b and to reduce the width of the second area 1012 (e.g., the bending region) of the second substrate 1010b Since the at least one third wiring 1061 and the at least one fourth wiring 1062 of the touch sensor 1002 are separated and doubly disposed in the third area 1013 (e.g., a bending region), it is possible to mitigate interference between a window (not shown) of an electronic device (e.g., 101 in FIG. 1) and the third area 1013 (e.g., the bending region) and to reduce the width of the third area 1013 (e.g., the bending region).

Figure 10:
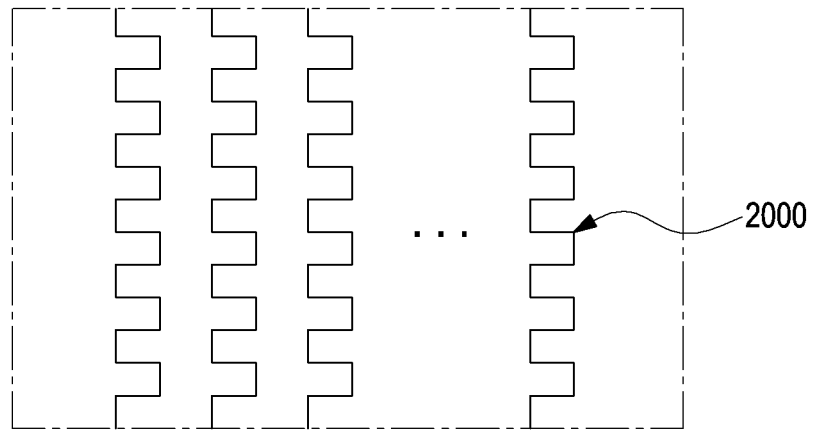
FIG. 10 is a front view showing the pattern of a second wiring of a display according to an embodiment of the disclosure.

FIG. 10 is a front view showing the pattern of a second wiring of a display according to an embodiment of the disclosure.

Figure 11:
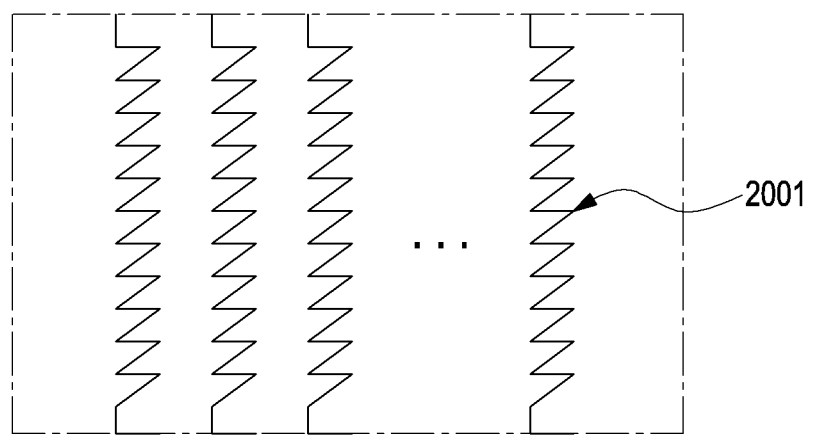
FIG. 11 is a front view showing another embodiment of the pattern of the second wiring of the display according to an embodiment of the disclosure.

FIG. 11 is a front view showing another embodiment of the pattern of the second wiring of the display according to an embodiment of the disclosure.

Referring to FIG. 10, the pattern of a second wiring 2000 may be formed in a shape similar to the waveform of a square wave. For example, the pattern of the second wiring 2000 may be a pattern in which if a side protrudes, the opposite side also protrudes.

Other patterns other than the pattern described above may be applied to the pattern of the second wiring 2000.

Referring to FIG. 11 showing another embodiment of the pattern of the second wiring, the pattern 2001 of the second wiring may be formed in a shape similar to the waveform of a triangle wave. For example, the pattern of the second wiring 2001 may be formed in a zigzag shape. Other patterns other than the pattern similar to the waveform of a triangle pattern may be applied to the pattern of the second wiring 2001.

According to various embodiments, a display may include: a pixel layer including a plurality of pixels; and a substrate disposed under the pixel layer and including a first area on which the pixel layer is disposed, and a second area extending out of the pixel layer from the first area, at least a partial area of the second area being bendable, wherein the substrate includes: a wiring layer including at least one first wiring electrically connected with at least one pixel of the plurality of pixels, and disposed from the first area to the second area, and at least one second wiring disposed in the at least partial area and electrically connected with the at least one first wiring in the second area.

According to various embodiments, the wiring layer may further include a first insulating layer and a second insulating layer, and the first insulating layer is disposed on the first area and the second insulating layer may be disposed on the second area.

According to various embodiments, the display may include one or more insulating layers disposed in the first area and at least one of the one or more insulating layers may at least partially include the same material as the first insulating layer.

According to various embodiments, the one or more insulating layers may include at least one of a TFE, a PDL, or a TFT Passivation layers.

According to various embodiments, a display may include: a display panel including a first area including a plurality of pixels, and a second area including a bendable bending region; at least one first wiring electrically connected with at least one pixel of the plurality of pixels, and disposed on the bending region of the second area; and at least one second wiring electrically connected with the at least one first wiring in the second area, and disposed on the bending region of the second area.

According to various embodiments, the substrate may be attached to the at least partial area of the bending region by an adhesive.

According to various embodiments, at least a portion of the second wiring may be wider than at least a portion of the first wiring.

According to various embodiments, a pattern of the second wiring may include a shape of at least one of a waveform of a square wave or a waveform of a triangle wave.

According to various embodiments, a display may include: a pixel layer including a plurality of pixels; and a substrate disposed under the pixel layer, including a first area on which the plurality of pixel layers is disposed, and a second area extending out of the pixel layer from the first area, at least a partial area of the second area being bendable, wherein the substrate includes: at least one first wiring electrically connected with at least one first pixels of the plurality of pixels, and disposed from the first area to the second area; and at least one second wiring electrically connected with at least one second pixels different from first pixels electrically connected with the first wiring, and disposed from the first area to the second area.

According to various embodiments, a wiring layer may be further included between the at least one first wiring and the at least one second wiring.

According to various embodiments, the wiring layer may further include a first insulating layer and a second insulating layer, in which the first insulating layer may be disposed on the first area and the second insulating layer may be disposed on the second area.

According to various embodiments, the at least one first wiring and the at least one second wiring may include at least one data line or at least one scan line.

According to various embodiments, the at least one data line may include first and second data lines, when seen from above the display, the first data line may be electrically connected with pixels disposed at odd-numbered positions of the plurality of pixels, and when seen from above the display, the second data line may be electrically connected with pixel layers disposed at even-numbered positions of the plurality of pixel layers. The at least one scan line may include first and second scan lines, the first scan line may be electrically connected with the pixels disposed at odd-numbered positions of the plurality of pixels, and the second scan line may be electrically connected with the pixels disposed at even-numbered positions of the plurality of pixels.

According to various embodiments, a display includes: a substrate including a first area and a second area extending from the first area, at least a partial area of the second area being bendable; at least one first wiring disposed from the first area to the second area; at least one second wiring disposed on the at least a partial area of the second area, and electrically connected with the at least one first wiring in the second area; and at least one wiring layer disposed between the at least one first wiring and the at least one second wiring and separating the at least one first wiring and the at least one second wiring.

According to various embodiments, the substrate may include at least one of a display substrate or a touch substrate.

According to various embodiments, the at least one first wiring may be disposed on a first surface of the at least one wiring layer and the at least one second wiring may be disposed on a second surface opposite to the first surface of the at least one wiring layer.

According to various embodiments, the at least one first wiring and the at least one second wiring may form double wires by being separated by the wiring layer.

According to various embodiments, the at least one wiring layer may further include a first insulating layer and a second insulating layer, and the first insulating layer may be disposed on the first area and the second insulating layer may be disposed on the second area.

According to various embodiments, the at least one wiring layer may include a wiring extension extending from the second insulating layer and covering the display driver of the display.

According to various embodiments, the at least one first wiring may include a data line or a scan line, the data line may be electrically connected with pixels disposed at odd-numbered positions of the plurality of pixel s, and the scan line may be electrically connected with pixels disposed at even-numbered positions of the plurality of pixels.

According to various embodiments, a display may include; a substrate including a first area, a second area extending from a first side of the first area, and a third area extending from a second side of the first area, at least a partial area of the second area being bendable, and at least a partial area of the third area being bendable; at least one first wiring disposed from the first side of the first area to the second area; at least one second wiring disposed on the at least a partial area of the second area, and electrically connected with the at least one first wiring in the second area; at least one third wiring disposed from the second side of the first area to the third area; and at least one fourth wiring disposed on the at least a partial area of the third area, and electrically connected with the at least third wiring in the third area.

According to various embodiments, a wiring layer separating the at least one first wiring and second wiring may be included between the at least one first wiring and the at least one second wiring.

According to various embodiments, the wiring layer may further includes a first insulating layer, a second insulating layer and a third insulating layer, and the first insulating layer may be disposed on the first area, the second insulating layer disposed between the at least one first wiring and the at least one second wiring and separating the at least one first wiring and the at least one second wiring is disposed on the second area, and the third insulating layer disposed between the at least one third wiring and the at least one fourth wiring and separating the at least third and the at least one fourth wiring is disposed on the third area.

According to various embodiments, the at least one first wiring and the at least one second wiring may be electrically connected with the display driver of the display, and the at least one third wiring and the at least one fourth wiring may be electrically connected with a touch panel display driver of the display.

According to various embodiments, a width of at least a portion of the second wiring may be greater than a width of at least a portion of the first wiring, and a width of at least a portion of the fourth wiring may be greater than a width of at least a portion of the at least one third wiring.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. A display comprising:
a display panel including a first area including a plurality of pixels, and a second area including a bendable bending region;
at least one first wiring electrically connected with at least one pixel of the plurality of pixels, and disposed on the first area and the bending region of the second area; and
at least one second wiring electrically connected with the at least one first wiring in the second area, and disposed on the bending region of the second area; and
a wiring layer including a first insulating layer and a second insulating layer, the first insulating layer being disposed on the first area and the second insulating layer being disposed on the second area, wherein the at least one first wiring is disposed on a bottom surface of the first insulating layer and the second insulating layer, and the at least one second wiring is disposed on a top surface of the second insulating layer.

2. The display of claim 1, further comprising:
a first insulating layer and a second insulating layer,
wherein the first insulating layer is disposed on the first area and the second insulating layer is disposed on the second area.

3. The display of claim 1, wherein at least a portion of a pattern of the second wiring includes a shape of at least one of a waveform of a square wave or a waveform of a triangle wave.

4. The display of claim 1, wherein a width of at least a portion of the second wiring is greater than a width of at least a portion of the first wiring.

5. A display comprising:
a substrate including a first area and a second area extending from a first side of the first area, at least a partial area of the second area being bendable;
at least one first wiring disposed from the first area to the second area;
at least one second wiring disposed on the at least a partial area of the second area, and electrically connected with the at least one first wiring in the second area;
at least one wiring layer disposed between the at least one first wiring and the at least one second wiring, and separating the at least one first wiring and the at least one second wiring; and
a wiring layer including a first insulating layer and a second insulating layer, the first insulating layer being disposed on the first area and the second insulating layer being disposed on the second area,
wherein the at least one first wiring is disposed on a bottom surface of the first insulating layer and the second insulating layer, and the at least one second wiring is disposed on a top surface of the first insulating layer and the second insulating layer.

6. The display of claim 5,
wherein the at least one first wiring includes a data line or a scan line,
wherein the data line is electrically connected with pixels disposed at odd-numbered positions of the plurality of pixels, and
wherein the scan line is electrically connected with pixels disposed at even-numbered positions of the plurality of pixels.

7. The display of claim 5, wherein the at least one wiring layer includes a wiring extension extending from the second insulating layer, and covering a display driver of the display.

8. The display of claim 5, wherein the at least one first wiring and the at least one second wiring form double wirings by being separated by the wiring layer.

9. The display of claim 5, wherein the substrate includes at least one of a display substrate or a touch substrate.

10. The display of claim 5,
wherein the substrate includes a third area extending from a second side of the first area, at least a partial area of the third area being bendable.

11. The display of claim 10, further comprising:
at least one third wiring disposed from the second side of the first area to the third area; and
at least one fourth wiring disposed on the at least a partial area of the third area, and electrically connected with the at least third wiring in the third area.

12. The display of claim 11,
wherein the wiring layer further includes a third insulating layer,
wherein the first insulating layer is disposed on the first area,
wherein the second insulating layer disposed between the at least one first wiring and the at least one second wiring, and separating the at least one first wiring and the at least one second wiring is disposed on the second area, and
wherein the third insulating layer disposed between the at least one third wiring and the at least one fourth wiring, and separating the at least third wiring and the at least one fourth wiring is disposed on the third area.

13. The display of claim 11,
wherein a width of at least a portion of the at least one second wiring is greater than a width of at least a portion of the at least one first wiring, and
wherein a width of at least a portion of the at least one fourth wiring is greater than a width of at least a portion of the at least one third wiring.

14. The display of claim 11,
wherein the at least one first wiring and the at least one second wiring are electrically connected with a display driver of the display, and
wherein the at least one third wiring and the at least one fourth wiring are electrically connected with a touch panel display driver of the display.

15. A display comprising:
a pixel layer including a plurality of pixels; and
a substrate disposed under the pixel layer and including a first area on which the pixel layer is disposed, and a second area extending out of the pixel layer from the first area, at least a partial area of the second area being bendable,
wherein the substrate includes:
at least one first wiring electrically connected with at least one pixel of the plurality of pixels, and disposed from the first area to the second area,
at least one second wiring disposed in the at least partial area, and electrically connected with the at least one first wiring in the second area, and
a wiring layer including a first insulating layer and a second insulating layer, the first insulating layer being disposed on the first area and the second insulating layer being disposed on the second area,
wherein the at least one first wiring is disposed on a bottom surface of the first insulating layer and the second insulating layer, and the at least one second wiring is disposed on a top surface of the second insulating layer.

16. The display of claim 15,
wherein the first insulating layer is disposed entirely within the first area, and
wherein the second insulating layer is disposed entirely within the second area.

17. The display of claim 15,
wherein the second insulating layer at least partially includes the same material as the first insulating layer.

18. The display of claim 17, wherein the first insulating layer or the second insulating layer includes at least one of a thin film encapsulation, a pixel define layer, or a thin film transistor passivation layer.

* * * * *